United States Patent [19]
Wyborn et al.

[11] Patent Number: 5,587,339
[45] Date of Patent: Dec. 24, 1996

[54] METHOD OF FORMING CONTACTS IN VIAS FORMED OVER INTERCONNECT LAYERS

[75] Inventors: Graeme M. Wyborn, Walton-on-Thames; Howard C. Nicholls, Penylan, both of United Kingdom

[73] Assignee: SGS-Thomson Microelectronics Ltd., United Kingdom

[21] Appl. No.: 480,954

[22] Filed: Jun. 7, 1995

Related U.S. Application Data

[63] Continuation of Ser. No. 119,421, Sep. 10, 1993, abandoned.

[30] Foreign Application Priority Data

Sep. 11, 1992 [GB] United Kingdom ............... 9219267

[51] Int. Cl.$^6$ ........................... H01L 21/44; H01L 21/48
[52] U.S. Cl. ........................ 437/195; 437/192; 437/194
[58] Field of Search ............................. 437/192, 194–195

[56] References Cited

U.S. PATENT DOCUMENTS

| | | | |
|---|---|---|---|
| 4,710,398 | 12/1987 | Homma et al. | 437/225 |
| 4,777,061 | 10/1988 | Wu et al. | 427/39 |
| 4,804,560 | 2/1989 | Shioya et al. | 427/125 |
| 4,902,645 | 2/1990 | Ohba | 437/200 |
| 4,917,759 | 4/1990 | Fisher et al. | 156/643 |
| 5,227,336 | 7/1993 | Hirano et al. | 437/192 |
| 5,270,254 | 12/1993 | Cheu et al. | 437/194 |
| 5,332,693 | 7/1994 | Kim | 437/194 |

FOREIGN PATENT DOCUMENTS

| | | |
|---|---|---|
| 0147203 | 7/1985 | European Pat. Off. . |
| 0256917 | 2/1988 | European Pat. Off. . |
| 0285410 | 10/1988 | European Pat. Off. . |
| 0305143 | 3/1989 | European Pat. Off. . |
| 0310108 | 4/1989 | European Pat. Off. . |
| 0269095 | 11/1987 | Germany . |
| 3916622A1 | 11/1989 | Netherlands . |
| 1564762 | 4/1980 | United Kingdom . |
| 2239661 | 7/1991 | United Kingdom . |

OTHER PUBLICATIONS

Wolf, Silicon Processing for VLSI Era, vol. 2–Process Technology, pp. 244–252, 1990.

A Planar Metallization Process–Its Application to Tri–Level Aluminum Interconnection; T. Moriya, S. Shima, Y. Hazuki, M. Chiba, and M. Kashiwagi, pp. 550–553; Dec. 5, 1983, IDEM.

Electrical Characteristics of Via Structures Containing Selective CVD Tungsten Plugs; S. L. Lanny Ng and P. Merchant; pp. 186–192; Jun. 15, 1987, V–MIC Conf./IEEE.

Patent Abstracts of Japan; vol. 13, No. 61 (C–567) (3409) Feb. 10, 1989; and JP–A–63 250 463 (Ulvac Corp.); Oct. 18, 1988.

Thick Tungsten Films in Multilayer Conductor Systems: Properties and Deposition Techniques; R. S. Blewer and V. A. Wells; pp. 153–158; Jun. 1984, V–MIC Conf.

Selective Chemical Vapor Deposition of Tungsten on Aluminum; R. Chow and S. Kang; pp. 208–215; Jun. 1987, V–MIC Conf.

(List continued on next page.)

Primary Examiner—H. Jey Tsai
Attorney, Agent, or Firm—Felsman, Bradley, Gunter & Dillon, LLP

[57] ABSTRACT

A method of fabricating a semiconductor device incorporating a via and an interconnect layer of aluminium or aluminium alloy. The invention provides a semiconductor device including a via and an interconnect layer of aluminium or aluminium alloy, a capping layer of electrically conductive material which has been formed over the interconnect layer and an electrically conductive contact which has been selectively deposited on the capping layer thereby to form a via, the materials of the capping layer and of the contact being selected whereby at the interface therebetween there is substantial absence of non-conductive compounds formed from the material of the capping layer.

22 Claims, 1 Drawing Sheet

OTHER PUBLICATIONS

Patent Abstracts of Japan, vol. 12, No. 306 (C-522) (3153) JP 63-76 876 Aug. 19,1988.
Selective Tungsten Processing by Low Pressure CVD; Eliot K. Broadbent and William T. Stacy; pp. 51-59, Solid State Technology.
Materials Research Society, "Advanced Metallization For ULSI Applications, Adhesion of LPCVD Wsix/W Bilayers on Oxide Films", pp. 304-310, 1992.

METHOD OF FORMING CONTACTS IN VIAS FORMED OVER INTERCONNECT LAYERS

This is a continuation of application Ser. No. 08/119,421, filed Sep. 10, 1993 abandoned.

BACKGROUND TO THE INVENTION

The present invention relates to a method of fabricating a semiconductor device incorporating an interconnect layer of aluminium or aluminium alloy and in particular relates to such a method in which contacts in the form of plugs or vias are formed over the interconnect layer.

In semiconductor processing technology it is well known that the step coverage obtained with conventional metallisation processes for the fabrication of contacts in the form of plugs and vias using metals such as aluminium can become a problem as the dimensions of the contacts are reduced below about 1.5 microns. The reduced step coverage tends to increase the specific contact resistivity of the contacts and the reliability of the contacts is reduced. Poor step coverage also tends to prevent vertical stacking of the contacts over contacts in the previous interconnect layer. Metal step coverage can be increased by reducing the thickness of the dielectric layer in which the contact is formed. However, this can consequently increase the capacitance between the two layers of metal which tends to produce a reduction in the speed of the resultant semiconductor device.

It is known, in an attempt to overcome this step coverage problem with conventional metallisation, to employ tungsten plug technology in which a contact hole is filled with tungsten by a chemical vapour deposition process to form a contact in the form of a plug or via. The two general tungsten deposition processes which are employed are blanket tungsten deposition followed by an etch back so as to leave tungsten contacts in a dielectric layer or selective tungsten deposition in which tungsten is selectively deposited in contact holes formed in the dielectric layer. The blanket deposition and etch back process suffers from a number of disadvantages such as the requirement to deposit a conformal adhesion layer to enable the tungsten layer to adhere to the underlying dielectric layer; the requirement for an additional etch back process; the difficulty of filling contacts of differing width; and the constraints on scaling the process to reduce the dimensions of the resultant contact structure. The selective tungsten plug deposition process does not suffer from these problems and accordingly the selective tungsten deposition has advantages over the blanket deposition and etch back process. Tungsten plugs, with low contact resistances, can be grown selectively on a variety of substrates including silicon, tungsten, titanium, titanium nitride and silicides. Aluminium and aluminium alloys are widely used to form a low resistance interconnect layer in semiconductor devices. However, selective tungsten growth on aluminium or aluminium alloys suffers from a very high specific contact resistance. This is in part due to the presence of an insulating aluminium oxide layer on the surface of the aluminium. The aluminium is covered by an insulating native oxide layer which cannot easily be removed before the selective tungsten deposition process. If the oxide layer is removed, for example by physical bombardment in a vacuum or by reactively etching the aluminium metal can also inadvertently be removed but this tends to leave pieces of aluminium or aluminium oxide over the surface of the dielectric layer which act as nucleation sites for the selective tungsten deposition.

The exposed aluminium also tends to form an insulating aluminium fluoride layer when exposed to the fluorine chemistry at an elevated temperature in the selective tungsten deposition process. This reaction competes with the reaction to form selective tungsten in the early stages of deposition and can result in the formation of the insulating layer between the aluminium and tungsten.

Thus there is a need for a process which enables tungsten contacts selectively to be grown in a reliable manner so as electrically to connect to an aluminium or aluminium alloy interconnect layer. The present invention aims to satisfy this need.

SUMMARY OF THE INVENTION

Accordingly, the present invention provides a method of fabricating a semiconductor device incorporating a via and an interconnect layer of aluminium or aluminium alloy, the method comprising the steps of: (a) providing a silicon wafer structure; (b) forming an interconnect layer of aluminium or aluminium alloy on the structure; (c) forming a capping layer over the interconnect layer, the capping layer being composed of electrically conductive material; (d) forming a dielectric layer on the capping layer; and (e) selectively depositing an electrically conductive contact on the capping layer in a contact hole of the dielectric layer thereby to form a via, the materials of the capping layer and of the contact being selected whereby after the contact has been deposited on the capping layer at the interface therebetween there is substantial absence of non-conductive compounds formed from the material of the capping layer.

The present invention also provides a semiconductor device including a via and an interconnect layer of aluminium or aluminium alloy, a capping layer of electrically conductive material which has been formed over the interconnect layer and an electrically conductive contact which has been selectively deposited on the capping layer thereby to form a via, the materials of the capping layer and of the contact being selected whereby at the interface therebetween there is substantial absence of non-conductive compounds formed from the material of the capping layer.

BRIEF DESCRIPTION OF THE DRAWINGS

Embodiments of the present invention will now be described by way of example only, with reference to the accompanying drawings, in which.

DETAILED DESCRIPTION OF THE PREFERRED EMBODIMENTS

Referring to FIGS. 1 to 5, there is shown a process flow for the fabrication of a tungsten contact in a dielectric layer, with the tungsten contact having being selectively deposited onto a capping layer which has been formed over an aluminium or aluminium alloy interconnect layer to which the tungsten contact is electrically connected. In this description, any reference to "aluminium" is intended to encompass "aluminium alloy".

Figure 1:
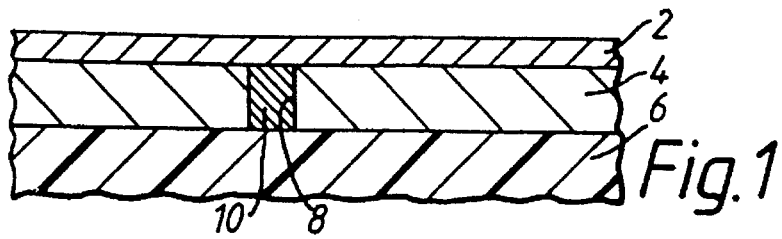
FIG. 1 is a schematic section through a silicon wafer structure having an interconnect layer prior to the deposition of a capping layer in accordance with an embodiment of the present invention.
Figure 2:
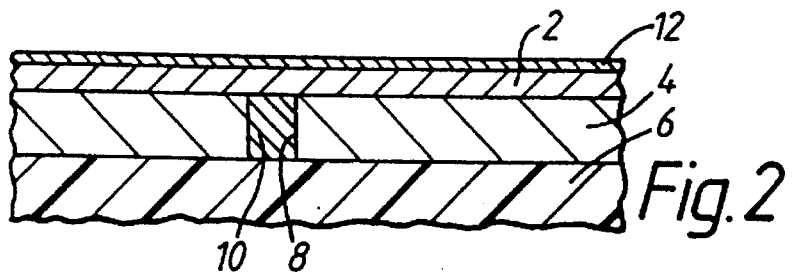
FIG. 2 is a schematic section through the silicon wafer structure of FIG. 1 after the capping layer has been deposited over the interconnect layer.

As is shown in FIG. 1, a typical silicon wafer structure, which may be utilised in accordance with the present invention, has an aluminium or aluminium alloy interconnect layer 2 extending over a dielectric layer 4 which itself extends over a silicon substrate 6. A contact hole 8 is located in the dielectric layer 4 and in the contact hole 8 is disposed a contact 10 of, for example, tungsten which electrically connects the silicon substrate 6 to the interconnect layer 2.

The interconnect layer 2 is, in accordance with the present invention, formed by a sputtering process in which the wafer structure is disposed in a sputtering apparatus so that the interconnect layer 2 is deposited on the dielectric layer 4 and contact 10 and the desired pattern is determined by a patterned photolithographic mask and etching (not shown). In accordance with the present invention, and as is shown with reference to FIG. 2, a capping layer 12 is deposited over the interconnect layer 2. The capping layer 12 is also formed by a sputtering process and is deposited in the same sputtering apparatus which is employed for sputtering the interconnect layer 2. Thus the capping layer 12 and the interconnect layer 2 are formed in a single process, having two sputtering steps, in a single sputtering apparatus. The capping layer is typically tungsten, titanium or titanium nitride. The deposition of the capping layer 12 over the more reactive aluminium or aluminium alloy interconnect layer 2 in the single sputtering apparatus prevents the formation of an aluminium oxide layer over the interconnect layer 2 which would result from the reaction of aluminium in atmospheric oxygen. The capping layer 12 acts as a relatively inert surface over the more reactive aluminium interconnect layer 2 and thus is not subject to subsequent atmospheric oxidation which could increase the resistivity of any subsequent electrical contact made with the capping layer 12. Typically, the aluminium interconnect layer 2 is around 5000 to 15000 Angstroms thick and the capping layer 12 has a thickness ranging from about 100 Angstroms to about 3000 Angstroms more preferably from 500 to 1000 Angstroms. The pattern of the capping layer 12 is defined using the same photolithographic masking layer as that which is employed to define the pattern of the underlying aluminium interconnect layer 2. This ensures that the capping layer 12 has exactly the same pattern as the underlying interconnect layer 2. In addition only a single masking process is utilised.

Figure 3:
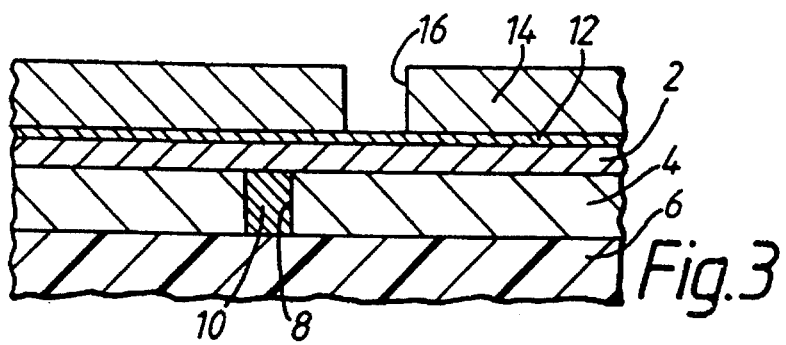
FIG. 3 is a schematic section through the silicon wafer structure of FIG. 2 after the deposited of a dielectric layer over the capping layer and the etching of a contact or via hole.
Figure 4:
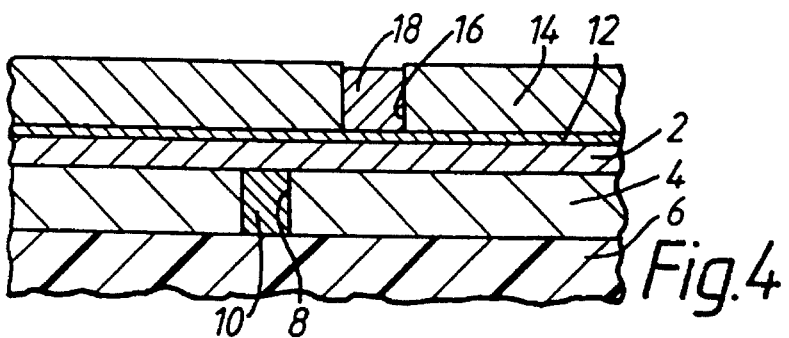
FIG. 4 is a schematic section through the silicon wafer structure of FIG. 3 after selective tungsten deposition into the contact hole of the dielectric layer so as to form a tungsten plug therein.

Referring to FIG. 3, a dielectric layer 14 is then deposited in known manner and in a desired pattern over the capping layer 12. Typically, the dielectric layer 14 comprises doped or undoped silicon oxide, silicon oxynitride or silicon nitride. The thickness of the dielectric layer 14 is typically from 5000 to 20000 Angstroms more preferably 10000 to 15000 Angstroms. The dielectric layer 14 is patterned to provide a contact hole 16. As is shown in FIG. 4, a contact 18 constituted typically by a tungsten plug 18 is then selectively deposited into the contact hole 16 in the dielectric layer 14. The contact 18 may alternatively be composed of selective copper or selective aluminium which has been deposited into the contact hole 16. When the contact 18 is not composed of tungsten, the capping layer 12 acts to prevent the formation of an aluminium fluoride layer on the aluminium interconnect layer 2 during the selective deposition process which ensures that a low resistance contact is formed between the via or contact 18 and the aluminium interconnect layer 2. The contact 18 may be in the form of a plug or a via.

The selected deposition process for depositing the contacts is preferably a two stage process when the contact is composed of tungsten. Such a two stage process is also particularly employed when the capping layer is composed of titanium. In the first stage, only a tungsten containing species is introduced above the silicon wafer structure in the absence of a reducing agent. Typically, a flow of tungsten hexafluoride is introduced for a period of from 30 to 200 seconds at a partial pressure of from 1 to 30 mTorr, more typically around 2 mTorr. It is believed that during this step the tungsten hexafluoride, in the absence of a conventional reducing agent, initially reacts with the surface of the capping layer, in particular a titanium surface, and it is believed that such reaction "cleans" the surface of species such as titanium oxide by reaction therewith. Such a reaction causes the tungsten hexafluoride to be reduced to tungsten so as to deposit a seed layer of tungsten on the capping layer and so as to reduce the concentration of non-conductive species, such as titanium oxide, on the surface of the capping layer. The use of this first stage in the tungsten contact deposition process employed in the present invention enables the creation of an acceptable contact resistance between the tungsten contact and the capping layer, whilst obtaining control of the process selectivity. In the second stage, a flow of suitable reducing agent, generally silane, is introduced into the tungsten hexafluoride flow in order to permit substantial deposition of the tungsten metal into the contact hole. The tungsten hexafluoride is reduced with the silane onto the clean seed layer of tungsten which has initially been formed. The partial pressure of silane is typically in the range from 1 to 30 mTorr, more typically about 1 mTorr giving a silane/tungsten hexafluoride ratio of around 0.5. Throughout the tungsten deposition process, the ambient temperature should be in the range 200° to 300° C.

Typically, a via formed on a capping layer of titanium or titanium nitride in accordance with the present invention has a specific contact resistivity of up to $2.5 \times 10^{-8}$ ohms $cm^2$, more preferably the specific contact resistivity being from $1.0 \times 10^{-9}$ to $1.2 \times 10^{-8}$ ohms $cm^2$. This can be contrasted with a substantially open circuit contact resistance of a tungsten contact on an aluminium interconnect layer which is measured at a potential which is sufficiently low so as not to break down the dielectric insulating aluminium compound such as aluminium oxide and/or aluminium fluoride at the interface between the tungsten and the aluminium. When the capping layer is titanium or itanium nitride, any titanium fluoride which is formed during the selective deposition of the contact is removed as a result of its volatility and so substantially no residual fluorides are left on the capping layer beneath the contact to raise the resistivity of the contact. In addition, the original titanium oxide layer in the capping layer which is formed as a result of prior atmospheric oxidation either easily reacts with the fluoride of the selective deposition process so as to be removed thereby or is sufficiently incoherent as a result of the presence of pin holes therein so as not to raise the resistivity of the contact. Thus any titanium oxide or fluoride, if formed, does not provide a high resistance contact as compared with the corresponding aluminium compounds which give rise to the problems in the prior art. Thus in accordance with the invention, in the resultant contact there are substantially no non-conductive compounds formed from the capping layer at the interface of the capping layer and the desposited metal which substantially increase the resistivity of the contact.

Figure 5:
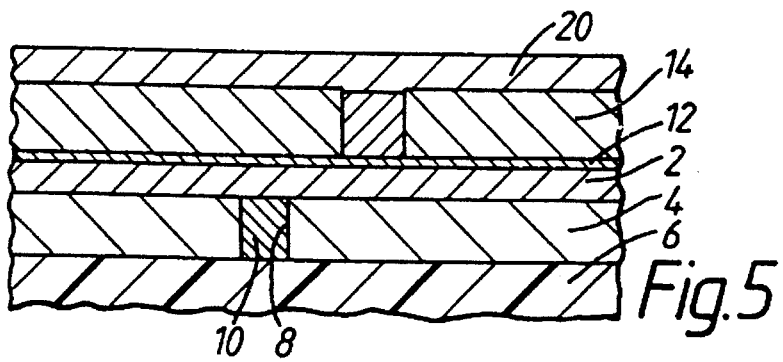
FIG. 5 is a schematic section through the silicon wafer structure of FIG. 4 after deposition of a second interconnect layer over the tungsten plug and the dielectric layer.

As is shown in FIG. 5, a second interconnect layer 20 of aluminium or aluminium alloy is deposited by a sputtering process over the dielectric layer 14 and the contact 18 so as to complete the interconnect structure.

The preferred embodiment of the present invention greatly enhances the usefulness of the selective tungsten deposition process for forming tungsten contacts by enabling tungsten contacts to be grown selectively on aluminum or aluminium alloy interconnect layers so as to provide a low resistivity contact therebetween.

Where titanium nitride or titanium is employed as the capping layer, this provides the additional advantage that the capping layer acts as a hillock suppressent layer on the aluminium which acts to prevent aluminium hillocks or spikes from being formed during further heat treatments which are required in multilevel metallisation processes. It is known that when aluminium interconnect layers are thermally cycled during the formation of subsequent interconnect layers, or when it is electrically stressed, the aluminium can form spikes which can lead to shorting between layers or degradation of the aluminium interconnect layers.

What we claim is:

1. A method of fabricating a semiconductor device incorporating a via and an interconnect layer of aluminum or aluminum alloy, the method comprising the steps of:
   (a) providing a silicon wafer structure;
   (b) forming an interconnect layer of aluminum or aluminum alloy on the structure;
   (c) forming a capping layer over the interconnect layer, the capping layer being composed of electrically conductive material;
   (d) forming a dielectric layer on the capping layer; and
   (e) selectively depositing an electrically conductive contact on the capping layer in a contact hole of the dielectric layer thereby to form a via, the materials of the capping layer and of the contact being selected wherein after the contact has been deposited on the capping layer at the interlace therebetween there is substantial absence of non-conductive compounds formed from the material of the capping layer, wherein the contact is tungsten and has been deposited in a two stage deposition process in which in the first stage a tungsten containing species is introduced, in the absence of a reducing agent for such species, over the silicon wafer structure, wherein the tunasten containing species reacts with the capping layer in the contact hole to deposit a tungsten seed layer on the capping layer, and in the second stage a reducing agent for that species is additionally introduced over the silicon wafer structure so as to reduce the tungsten containing species and deposit tungsten over the seed layer in the contact hole.

2. A method according to claim 1 wherein the capping layer is selected from the group consisting of tungsten, titanium and titanium nitride.

3. A method according to claim 1 wherein the interconnect layer and the capping layer are both formed in a single deposition apparatus.

4. A method according to claim 3 wherein the interconnect layer and the capping layer are formed by sputtering.

5. A method according to claim 3 wherein the interconnect layer and the capping layer are patterned by a common masking layer.

6. A method according to claim 1 wherein the specific contact resistivity of the via is up to $2.5 \times 10^{-8}$ ohms cm$^2$.

7. A method of fabricating a semiconductor device incorporating a via and an interconnect layer of aluminum or aluminum alloy, the method comprising the steps of:
   (a) providing a silicon wafer structure;
   (b) forming an interconnect layer of aluminum or aluminum alloy on the structure;
   (c) forming a capping layer over the interconnect layer, the capping layer being selected from the group consisting of tungsten, titanium and titanium nitride;
   (d) forming a dielectric layer on the capping layer; and
   (e) selectively depositing a tungsten contact on the capping layer in a contact hole of the dielectric layer thereby to form a via, wherein the contact is deposited in a two stage deposition process in which in the first stage a tungsten containing species is introduced, in the absence of a reducing agent for such species, over the wafer structure, wherein the tungsten containing species reacts with the capping layer in the contact hole to deposit a tungsten seed layer on the capping layer, and in the second stage a reducing agent for that species is additionally introduced over the silicon wafer structure so as to reduce the tungsten containing species and deposit tungsten over the seed layer in the contact hole.

8. A method according to claim 7 wherein the interconnect layer and the capping layer are both formed in a single deposition apparatus.

9. A method according to claim 8 wherein the interconnect layer and the capping layer are formed by sputtering.

10. A method according to claim 8 wherein the interconnect layer and the capping layer are patterned by a common masking layer.

11. A method according to claim 7 wherein the specific contact resistivity of the via is up to $2.5 \times 10^{-8}$ ohms cm$^2$.

12. A method of fabricating a semiconductor device incorporating a via and a conductive interconnect layer, the method comprising the steps of:
   (a) providing a silicon wafer structure;
   (b) forming a conductive interconnect layer on the structure;
   (c) forming a capping layer over the interconnect layer, the capping layer being composed of electrically conductive material;
   (d) forming a dielectric layer on the capping layer; and
   (e) selectively depositing an electrically conductive contact on the capping layer in a contact hole of the dielectric layer thereby to form a via, the materials of the capping layer and of the contact being selected wherein after the contact has been deposited on the capping layer at the interface therebetween there is substantial absence of non-conductive compounds formed from the material of the capping layer, wherein the contact is tungsten and has been deposited in a two stage deposition process in which in the first stage a tungsten containing species is introduced, in the absence of a reducing agent for such species, over the silicon wafer structure, wherein the tungsten containing species reacts with the capping layer in the contact hole to deposit a tungsten seed layer on the capping layer, and in the second stage a reducing agent for that species is additionally introduced over the silicon wafer structure so as to reduce the tungsten containing species and deposit tungsten over the seed layer in the contact hole.

13. A method according to claim 12 wherein the capping layer is selected from the group consisting of tungsten, titanium and titanium nitride.

14. A method according to claim 12 wherein the interconnect layer and the capping layer are both formed in a single deposition apparatus.

15. A method according to claim 14 wherein the interconnect layer and the capping layer are formed by sputtering.

16. A method according to claim 14 wherein the interconnect layer and the capping layer are patterned by a common masking layer.

17. A method according to claim 12, wherein the specific contact resistivity of the via is up to $2.5 \times 10^{-8}$ ohms cm$^2$.

18. A method of fabricating a semiconductor device incorporating a via and a conductive interconnect layer, the method comprising the steps of:

(a) providing a silicon wafer structure;

(b) forming a conductive interconnect layer on the structure;

(c) forming a capping layer over the interconnect layer, the capping layer being selected from the group consisting of tungsten, titanium and titanium nitride;

(d) forming a dielectric layer on the capping layer; and (e) selectively depositing a tungsten contact on the capping layer in a contact hole of the dielectric layer thereby to form a via, wherein the contact is deposited in a two stage deposition process in which in the first stage a tungsten containing species is introduced, in the absence of a reducing agent for such species, over the wafer structure, wherein the tungsten containing species reacts with the capping layer in the contact hole to deposit a tungsten seed layer on the capping layer, and in the second stage a reducing agent for that species is additionally introduced over the silicon wafer structure so as to reduce the tungsten containing species and deposit tungsten over the seed layer in the contact hole.

19. A method according to claim 15 wherein the interconnect layer and the capping layer are both formed in a single deposition apparatus.

20. A method according to claim 19 wherein the interconnect layer and the capping layer are formed by sputtering.

21. A method according to claim 19 wherein the interconnect layer and the capping layer are patterned by a common masking layer.

22. A method according to claim 18 wherein the specific contact resistivity of the via is up to $2.5 \times 10^{-8}$ ohms cm$^2$.

* * * * *